US011676799B2

(12) United States Patent
Yamagishi et al.

(10) Patent No.: US 11,676,799 B2
(45) Date of Patent: Jun. 13, 2023

(54) PLASMA PROCESSING APPARATUS

(71) Applicant: Tokyo Electron Limited, Tokyo (JP)

(72) Inventors: Koji Yamagishi, Miyagi (JP); Hiroshi Ikeda, Miyagi (JP); Hiroyuki Kondo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 79 days.

(21) Appl. No.: 17/198,043

(22) Filed: Mar. 10, 2021

(65) Prior Publication Data
US 2021/0287879 A1 Sep. 16, 2021

(30) Foreign Application Priority Data

Mar. 13, 2020 (JP) .............................. JP2020-043798

(51) Int. Cl.
*H01J 37/32* (2006.01)
(52) U.S. Cl.
CPC .. *H01J 37/32183* (2013.01); *H01J 37/32449* (2013.01); *H01J 37/32541* (2013.01); *H01J 37/32577* (2013.01); *H01J 2237/3344* (2013.01)

(58) Field of Classification Search
CPC ........... H01J 37/32183; H01J 37/32449; H01J 37/32541; H01J 37/32577
See application file for complete search history.

(56) References Cited

U.S. PATENT DOCUMENTS

| 10,448,495 | B1* | 10/2019 | Dorf ................. | H01J 37/32174 |
| 2009/0274590 | A1* | 11/2009 | Willwerth ......... | H01L 21/68792 |
| | | | | 422/186.04 |
| 2010/0000684 | A1* | 1/2010 | Choi ................. | H01L 21/68785 |
| | | | | 156/345.43 |
| 2011/0005679 | A1* | 1/2011 | Hanawa ............ | H01J 37/32174 |
| | | | | 156/345.24 |
| 2013/0213575 | A1* | 8/2013 | Kim .................. | H01J 37/32541 |
| | | | | 315/111.21 |
| 2014/0008352 | A1* | 1/2014 | Uemura ............ | H01J 37/32724 |
| | | | | 219/601 |

FOREIGN PATENT DOCUMENTS

JP 2000-331996 A 11/2000

\* cited by examiner

*Primary Examiner* — Tung X Le
(74) *Attorney, Agent, or Firm* — Weihrouch IP

(57) ABSTRACT

A plasma processing apparatus includes a chamber; a first electrode facing an inside of the chamber; a radio-frequency power supply configured to supply a radio-frequency power to the first electrode; a feeding rod configured to feed the radio-frequency power to a center of a surface of the first electrode opposite to a surface facing the inside of the chamber; a conductive plate provided in parallel to the surface of the first electrode opposite to the surface facing the inside of the chamber, the plate being grounded; and a dielectric plate connecting the first electrode and the conductive plate, and having a shape that is rotationally symmetric with respect to a center of the first electrode.

19 Claims, 16 Drawing Sheets

PLASMA PROCESSING APPARATUS

CROSS-REFERENCE TO RELATED APPLICATIONS

This application is based on and claims priority from Japanese Patent Application No. 2020-043798, filed on Mar. 13, 2020 with the Japan Patent Office, the disclosure of which is incorporated herein in its entirety by reference.

TECHNICAL FIELD

The present disclosure relates to a plasma processing apparatus.

BACKGROUND

A capacitively-coupled plasma processing apparatus has been known as a type of plasma processing apparatus. In a capacitively-coupled plasma processing apparatus, for example, a pair of parallel flat plate electrodes (an upper electrode and a lower electrode) is disposed within a chamber, a processing gas is introduced into the chamber, and a radio-frequency power is applied to one side electrode so as to form plasma of the processing gas. Here, when the radio-frequency power applied to the electrode is increased to increase the density of the plasma, standing waves are likely to be generated on the electrode surface due to the harmonics. When the standing waves are generated, electric field distribution on the electrode surface becomes non-uniform, and the plasma density also becomes non-uniform. In the meantime, it has been suggested that a conductive member is provided on a feeding rod that applies a radio frequency to the electrode and the opposite side of the electrode, and is grounded so that the inductance of the feeding rod is reduced, and the plasma density becomes uniform. See, for example, Japanese Patent Laid-Open Publication No. 2000-331996.

SUMMARY

A plasma processing apparatus according to one aspect of the present disclosure includes a chamber, a first electrode, a radio-frequency power supply, a feeding rod, a plate-shaped member, and a dielectric. The first electrode is an electrode facing the inside of the chamber. The radio-frequency power supply supplies radio-frequency power to the first electrode. The feeding rod feeds the radio-frequency power to the center of a surface of the first electrode opposite to a surface facing the inside of the chamber. The plate-shaped member is a grounded conductive plate-shaped member that is provided in parallel to the surface of the first electrode opposite to the surface facing the inside of the chamber. The dielectric connects the first electrode to the plate-shaped member, and has a shape that is rotationally symmetric with respect to the center of the first electrode.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the disclosed plasma processing apparatus will be described in detail with reference to drawings. The disclosed technology is not limited by the following embodiments.

Plasma processing apparatuses have recently been required to supply radio-frequency power having a higher frequency (for example, about 100 MHz) in order to cope with further miniaturization. In some cases, as the frequency becomes higher, the electric field distribution becomes non-uniform, and the plasma density also becomes non-uniform in the circumferential direction of the outer periphery of an electrode due to the arrangement of an introduction pipe for a processing gas or a flow path for a chiller coolant which are present between the opposite side of the electrode and a housing. In particular, when a part of the introduction pipe or the flow path pipe is made of metal, the electric field distribution is likely to be non-uniform. Therefore, it is expected to generate highly uniform plasma in the circumferential direction of the outer periphery of the electrode.

First Embodiment

[Configuration of Plasma Processing Apparatus 1]

Figure 1:
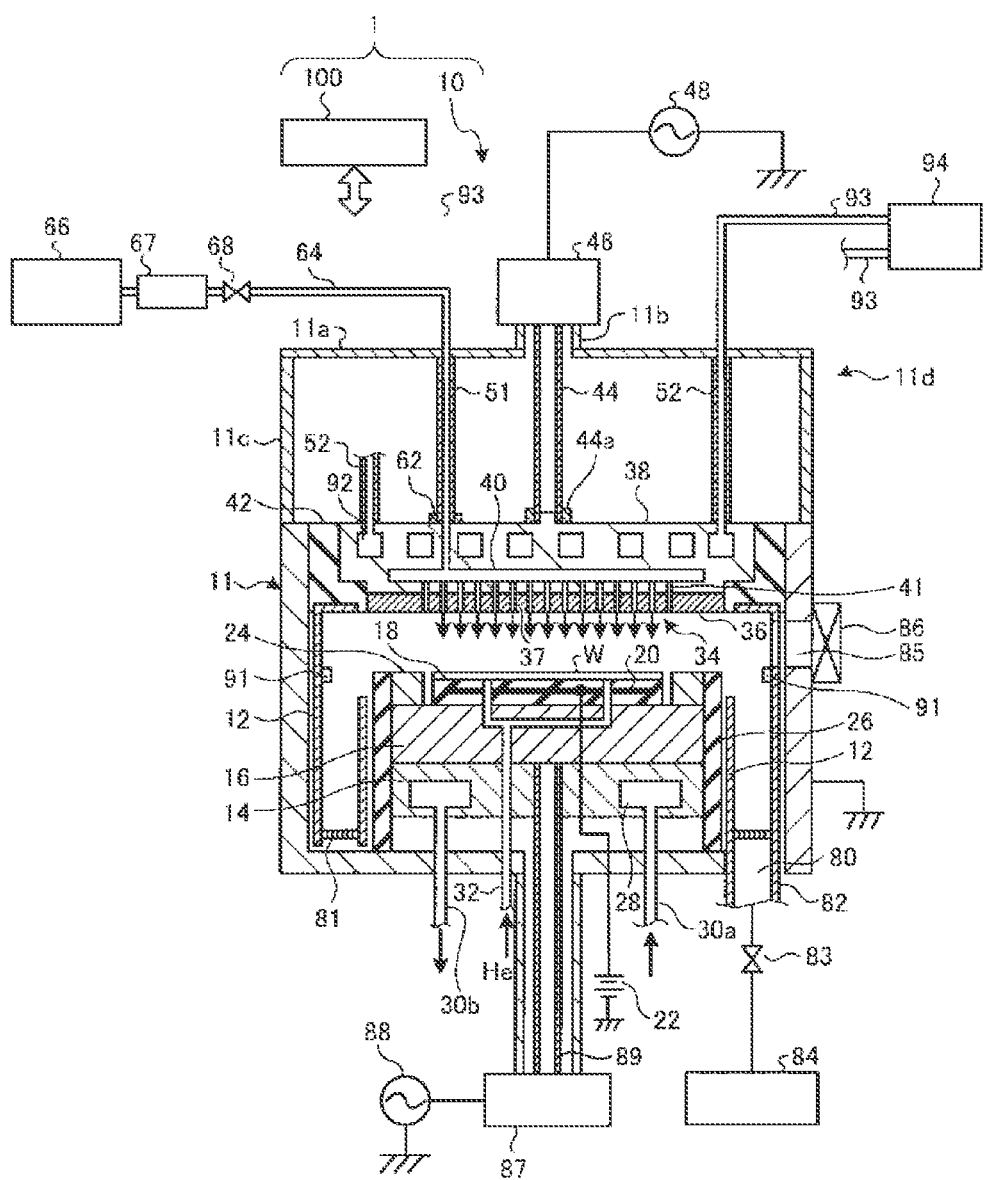
FIG. 1 is a view illustrating an example of a plasma processing apparatus in a first embodiment of the present disclosure.

FIG. 1 is a view illustrating an example of a plasma processing apparatus in a first embodiment of the present disclosure. A plasma processing apparatus 1 is an apparatus that performs plasma processing such as etching or film formation on a semiconductor wafer (hereinafter, referred to as a wafer) as an example of a processing target object. The plasma processing apparatus 1 includes a device main body 10 and a control device 100. The plasma processing apparatus 1 is disposed within, for example, a clean room where the temperature and humidity of air are controlled in predetermined ranges.

The device main body 10 has, for example, a substantially cylindrical chamber 11 made of, for example, aluminum whose surface is anodized. The chamber 11 is grounded for security. For example, a cylindrical support base 14 is disposed on the bottom of the chamber 11 through a cylindrical support member 26 made of, for example, quartz, and for example, a stage 16 made of, for example, aluminum is provided on the support base 14. The stage 16 also functions as a lower electrode.

An electrostatic chuck 18 that attracts and holds the wafer W by an electrostatic force is provided on the top surface of the stage 16. The electrostatic chuck 18 has a structure where an electrode 20 including a conductive film is interposed between a couple of insulating layers or insulating sheets. A DC power supply 22 is electrically connected to the electrode 20. The wafer W is attracted and held on the top surface of the electrostatic chuck 18 by an electrostatic force such as a Coulomb force generated on the top surface of the electrostatic chuck 18 due to a DC voltage applied from the DC power supply 22.

A conductive edge ring 24 made of, for example, silicon is disposed around the electrostatic chuck 18 at a position of the top surface of the stage 16 in order to improve the uniformity of etching. The support member 26 is disposed on the side surfaces of the stage 16 and the support base 14.

A flow path 28 is provided within the support base 14, and a coolant is supplied into the flow path 28 through a pipe 30a from a chiller unit provided outside the chamber 11. The coolant supplied into the flow path 28 is returned to the chiller unit through a pipe 30b. The chiller unit controls the temperature of the coolant supplied into the flow path 28. As the temperature-controlled coolant circulates through the inside of the flow path 28, the temperature of the support base 14 is controlled, and the temperature of the wafer W on the electrostatic chuck 18 is controlled through the stage 16 and the electrostatic chuck 18 on the support base 14.

A pipe 32 is provided within the support base 14, the stage 16, and the electrostatic chuck 18. A heat transfer gas supplied from a heat transfer gas supply mechanism (not illustrated) to the pipe 32 is supplied between the wafer W and the electrostatic chuck 18 through the pipe 32. The heat transfer gas is, for example, a helium gas. It is possible to control a heat transfer rate between the wafer W and the electrostatic chuck 18 by controlling the pressure of the heat transfer gas supplied between the wafer W and the electrostatic chuck 18.

Above the stage 16, a shower head 34 is provided while facing the stage 16 substantially in parallel to the stage 16. The shower head 34 also functions as an upper electrode. That is, the shower head 34 and the stage 16 function as a couple of electrodes (an upper electrode and a lower electrode, or a first electrode and a second electrode). A space between the shower head 34 and the stage 16 becomes a plasma generation space.

The shower head 34 is supported on the upper portion of the chamber 11 via an insulating shielding member 42. The shower head 34 includes a top plate 36 disposed to face the stage 16, and a base member 38 that supports the top plate 36 from above.

A plurality of discharge holes 37 that jets a processing gas into the chamber 11 is formed through the top plate 36 in the thickness direction. The top plate 36 is made of, for example, silicon or SiC.

The base member 38 is made of a conductive material such as, for example, aluminum whose surface is anodized, and detachably supports the top plate 36 under the base member 38. A diffusion chamber 40 configured to supply a processing gas to the plurality of discharge holes 37 is formed within the base member 38. At the bottom of the base member 38, a plurality of passage holes 41 is formed so as to be located under the diffusion chamber 40. The passage holes 41 communicate with the discharge holes 37, respectively.

An introduction port 62 configured to introduce a processing gas to the diffusion chamber 40 is formed in the base member 38. One end of a dielectric 51 having a through hole is connected to the introduction port 62. One end of a pipe 64 is connected to the other end of the dielectric 51 through an introduction port provided in a plate-shaped member 11a. A gas supply source 66 that supplies a processing gas is connected to the other end of the pipe 64. In the pipe 64, a mass flow controller (MFC) 67 and a valve 68 are provided in this order from the upstream side. When plasma processing is performed on the wafer W on the electrostatic chuck 18, the processing gas supplied from the gas supply source 66 is supplied into the diffusion chamber 40 via the pipe 64 and the through hole of the dielectric 51, and is diffused within the diffusion chamber 40. The processing gas diffused within the diffusion chamber 40 is supplied in a shower form into the chamber 11 via the passage holes 41 and the discharge holes 37.

A flow path 92 is provided within the base member 38, and a coolant is supplied from a chiller unit 94 provided outside the chamber 11 into the flow path 92 via a pipe 93 and a dielectric 52 having a through hole. One end of the dielectric 52 is connected to the flow path 92. The pipe 93 is connected to the other end of the dielectric 52 via an introduction port provided in the plate-shaped member 11a. In the following descriptions, the dielectrics 51 and 52 not distinguished from each other and a dummy dielectric are referred to as dielectrics 50. The dielectrics 51 and 52 and the dummy dielectric have the same shapes and materials. Materials of the dielectrics 50 may be materials having the same or similar dielectric permittivities as (to) each other, and, for example, fluororesin such as, for example, poly phenylene sulfide (PPS) or poly tetra fluoro ethylene (PTFE) may be used. When the plurality of dielectrics 50 is collectively referred to as a dielectric, the dielectric 50 is an example of each of portions of the dielectric.

The coolant supplied into the flow path 92 of the base member 38 via the pipe 93 and the through hole of the dielectric 52 from the chiller unit 94 circulates through the inside of the flow path 92, and is returned to the chiller unit 94 via the through hole of the dielectric 52 and the pipe 93. The chiller unit 94 controls the temperature of the coolant supplied into the flow path 92. The chiller unit 94 is an example of a temperature controller. As the temperature-controlled coolant circulates through the inside of the flow path 92, a temperature rise of the shower head 34, which is caused by heat input from plasma generated between the stage 16 and the shower head 34, is suppressed.

The temperature of the coolant circulating through the inside of the flow path 92 is a temperature lower than a dew point temperature of the outside air of the chamber 11. In the present embodiment, the temperature of the coolant is, for example, a temperature of 0° C. or less. The base member 38 in which the flow path 92 is formed is an example of a cooling unit.

A radio frequency (RF) introduction unit 44a is provided in the base member 38, and a radio-frequency power supply 48 is electrically connected via a feeding rod 44 and a matcher 46. In the present embodiment, the feeding rod 44 is a hollow cylindrical member made of a conductive metal such as aluminum. The radio-frequency power supply 48 is a power supply for plasma generation, and generates radio-frequency power having a frequency of 13.56 MHz or more, for example, 60 MHz to 100 MHz. The radio-frequency power generated by the radio-frequency power supply 48 is supplied to the base member 38 via the matcher 46 and the feeding rod 44. The matcher 46 matches a load impedance to an internal (or output) impedance of the radio-frequency power supply 48. The matcher 46 functions to seemingly match the load impedance to the output impedance of the radio-frequency power supply 48 when plasma is generated within the chamber 11. The output terminal of the matcher 46 is electrically connected to the upper end of the feeding rod 44.

The shower head 34 and the feeding rod 44 are covered with a substantially cylindrical cover member 11d provided above the side wall of the chamber 11. The cover member 11d is made of a conductive material such as aluminum and is grounded through the chamber 11. Accordingly, the radio-frequency power supplied to the shower head 34 is suppressed from leaking to the outside of the device main body 10. The cover member 11d has the plate-shaped member 11a, a tubular member 11b, and a wall member 11c. The plate-shaped member 11a is a top wall of the cover member 11d and is provided substantially in parallel to the shower head 34. The tubular member 11b covers the periphery of the feeding rod 44, and connects the plate-shaped member 11a to the matcher 46. The wall member 11c connects the upper end of the side wall of the chamber 11 to the plate-shaped member 11a. The plate-shaped member 11a is provided with the introduction ports through which the dielectric 51 and the dielectric 52 are connected to the pipe 64 and the pipe 93. The feeding rod 44 connects the base member 38 to the matcher 46 through the central portion of the tubular member 11b. The space covered by the cover member 11d is under atmospheric pressure.

A radio-frequency power supply 88 is electrically connected to the stage 16 functioning as the lower electrode, via a feeding rod 89 and a matcher 87. The radio-frequency power supply 88 is a power supply for ion attraction (for bias), and supplies radio-frequency power having a frequency within a range of 300 kHz to 13.56 MHz, for example, 2 MHz, to the stage 16. The matcher 87 matches a load impedance to an internal (or output) impedance of the radio-frequency power supply 88. The matcher 87 functions to seemingly match the load impedance to the internal impedance of the radio-frequency power supply 88 when plasma is generated within the chamber 11.

An exhaust port 80 is provided on the bottom of the chamber 11. An exhaust device 84 is connected to the exhaust port 80 via an exhaust pipe 82 and an auto pressure control (APC) valve 83. The exhaust device 84 has a vacuum pump such as a turbo molecular pump, and is capable of depressurizing the inside of the chamber 11 to a desired degree of vacuum. The APC valve 83 adjusts the pressure within the chamber 11.

An opening 85 through which the wafer W is loaded and unloaded is provided in the side wall of the chamber 11, and the opening 85 is opened/closed by a gate valve 86. A deposition shield 12 is detachably provided on the inner wall of the chamber 11 so as to prevent etching by-product (deposition) from adhering to the chamber 11. The deposition shield 12 is also provided on the outer periphery of the support member 26. An exhaust plate 81 is provided between the deposition shield 12 on the side wall side of the chamber 11 and the deposition shield 12 on the support member 26 side, on the bottom of the chamber 11. As for the deposition shield 12 and the exhaust plate 81, an aluminum material coated with ceramic such as $Y_2O_3$ may be appropriately used.

A GND block 91 that is composed of a conductive member and is connected to the ground in a DC manner is provided in the deposition shield 12 disposed along the inner wall of the chamber 11, at a position having substantially the same height as the wafer W. The GND block 91 prevents abnormal discharge in the chamber 11.

Operations of the device main body 10 configured as described above are collectively controlled by the control device 100. The control device 100 includes a processor, a memory, and an input/output interface. The memory stores, for example, a program or a processing recipe. By executing the program read from the memory, the processor controls each part of the device main body 10 through the input/output interface according to the processing recipe read from the memory.

When the wafer W is processed by using plasma in the plasma processing apparatus 1 configured as described above, the control device 100 performs, for example, the following control on each part of the plasma processing apparatus 1. First, in a state where the wafer W is placed on the electrostatic chuck 18, the control device 100 controls the MFC 67 and the valve 68 to supply a processing gas at a predetermined flow rate into the diffusion chamber 40. The processing gas supplied into the diffusion chamber 40 is diffused within the diffusion chamber 40, and is supplied in a shower form into the chamber 11 through the plurality of passage holes 41 and the plurality of discharge holes 37. The control device 100 controls the APC valve 83 and the exhaust device 84 so that the inside of the chamber 11 is controlled under a predetermined pressure.

Then, the control device 100 causes the radio-frequency power supply 48 to generate radio-frequency power with a predetermined frequency, which is used for plasma generation, and supplies the radio-frequency power to the shower head 34 via the feeding rod 44. Accordingly, the processing gas within the chamber 11 is formed into plasma. The control device 100 causes the radio-frequency power supply 88 to generate radio-frequency power with a predetermined frequency, which is used for ion attraction (bias), and supplies the radio-frequency power to the stage 16. Accordingly, charged particles such as ions in plasma are attracted by the wafer W on the electrostatic chuck 18. Accordingly, predetermined plasma processing such as etching is performed on the wafer W on the electrostatic chuck 18.

[Details of Cover Member 11*d*]

Figure 2:
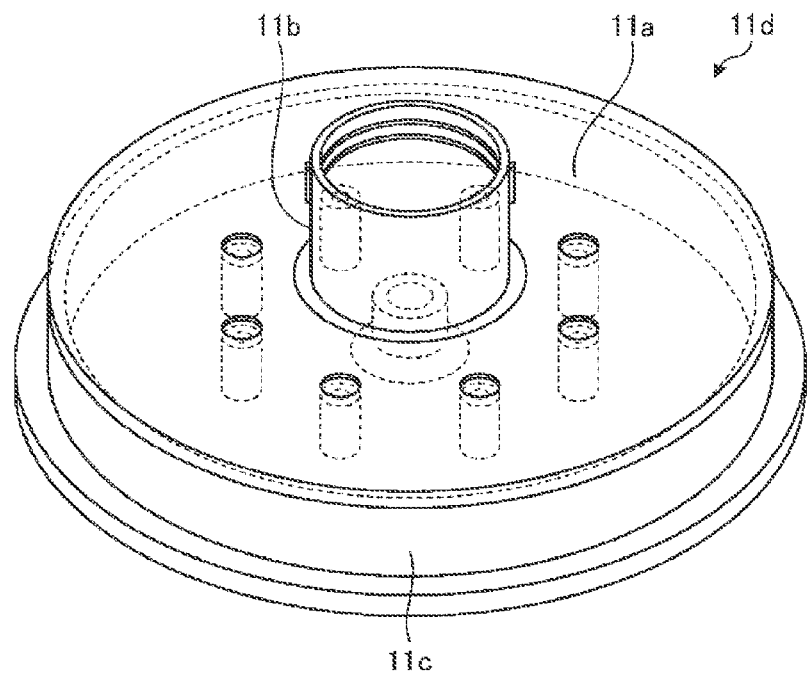
FIG. 2 is a view illustrating an example of the configuration of a cover member on the upper portion of a chamber in the first embodiment.

FIG. 2 is a view illustrating an example of the configuration of the cover member on the upper portion of the chamber in the first embodiment. As illustrated in FIG. 2, in the cover member 11*d*, the plate-shaped member 11*a* is provided as if a lid covers the top of the wall member 11*c*. In the cover member 11*d*, the tubular member 11*b* is provided in the central portion of the plate-shaped member 11*a*. In the example of FIG. 2, the plate-shaped member 11*a* is provided with eight introduction ports to which the dielectrics 50 are connected.

[Arrangement of Dielectrics 50]

Figure 3:
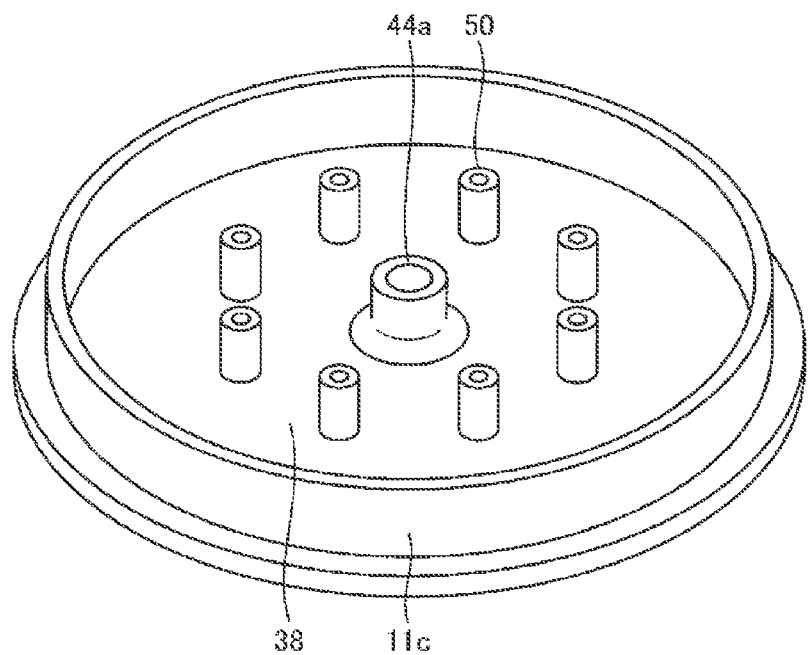
FIG. 3 is a perspective view illustrating an example of the arrangement of dielectrics on the upper portion of the chamber in the first embodiment.

FIG. 3 is a perspective view illustrating an example of the arrangement of dielectrics on the upper portion of the chamber in the first embodiment. FIG. 3 illustrates the base member 38, the RF introduction unit 44*a* provided in the central portion of the base member 38, and the eight dielectrics 50 arranged to surround the central portion of the base member 38, in a state where the plate-shaped member 11*a* and the tubular member 11*b* are removed. The dielectrics 50 are arranged at equal intervals so as to be rotationally symmetric on, for example, the circumference of a circle whose center coincides with the center of the base member 38 of the shower head 34 (the upper electrode). That is, the dielectrics 50 are arranged at equal intervals so as to be rotationally symmetric at the same distances from the RF introduction unit 44*a*.

Figure 4:
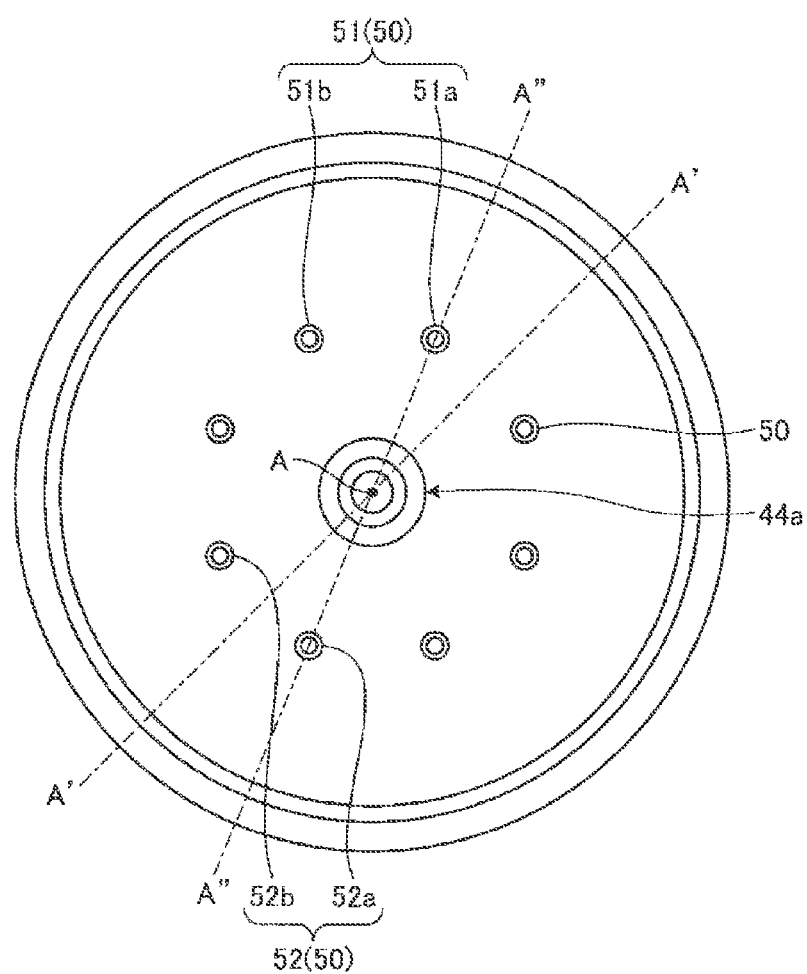
FIG. 4 is a plan view illustrating an example of the arrangement of the dielectrics on the upper portion of the chamber in the first embodiment.

FIG. 4 is a plan view illustrating an example of the arrangement of dielectrics on the upper portion of the chamber in the first embodiment. FIG. 4 is an example of a case where among the eight dielectrics 50, dielectrics 51*a* and 51*b* are used for processing gas introduction, dielectrics 52*a* and 52*b* are used for a coolant, and four remaining dielectrics 50 are set as dummies. As illustrated in FIG. 4, since the introduction ports for the processing gas and the coolant are provided axisymmetrically from the RF introduction unit 44*a*, in the arrangement of the dielectrics 50, the axisymmetry is maintained between the shower head 34 (the upper electrode) and the cover member 11*d* (the housing). The dielectrics 50 including the dummy dielectrics 50 have the same shapes.

Figure 5:
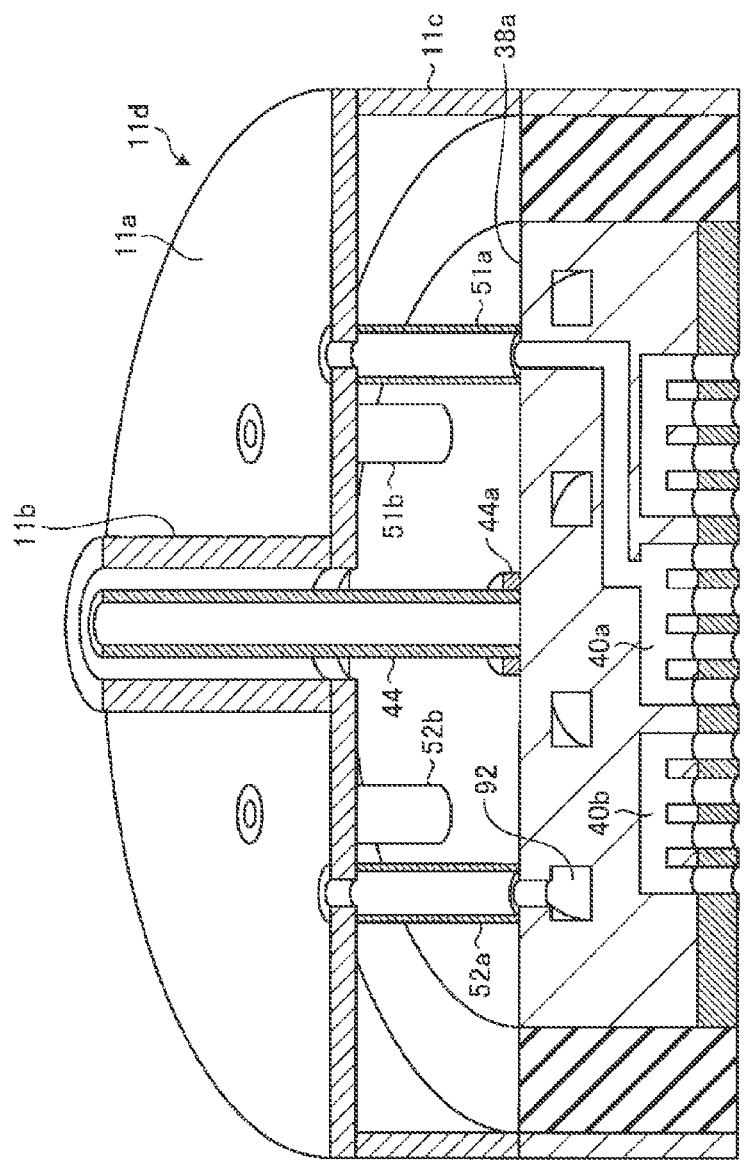
FIG. 5 is a perspective sectional view illustrating an example of the configuration of the upper portion of the chamber in the first embodiment.

FIG. 5 is a perspective sectional view illustrating an example of the configuration of the upper portion of the chamber in the first embodiment. FIG. 5 is an example of a cross section of the upper portion of the chamber, on the line A"-A-A" illustrated in FIG. 4. In FIG. 5, instead of the base member 38, a base member 38*a*, which has a diffusion chamber 40*a* corresponding to the central portion of the wafer W, and a diffusion chamber 40*b* corresponding to the edge portion of the wafer W, is used. As illustrated in FIG. 5, the dielectrics 51*a*, 51*b*, 52*a*, and 52*b* are vertically arranged in a space between the plate-shaped member 11*a* and the base member 38*a*. On the back side of the feeding rod 44, similarly, the dielectrics 50 are vertically arranged. The dielectric 51*a* is arranged such that the internal through hole fluidly communicates with the diffusion chamber 40*a*. The dielectric 51*b* is arranged such that the internal through hole fluidly communicates with the diffusion chamber 40*b*. The dielectrics 52*a* and 52*b* are arranged such that the internal through holes fluidly communicate with the flow path 92. For example, the coolant circulates in the order of the dielectric 52*a*, the flow path 92, and the dielectric 52*b*. At the central portion of the base member 38*a*, the RF introduction unit 44*a* is provided, to which the feeding rod 44 is connected.

[Supply Route of Radio-Frequency Power]

Figure 6:
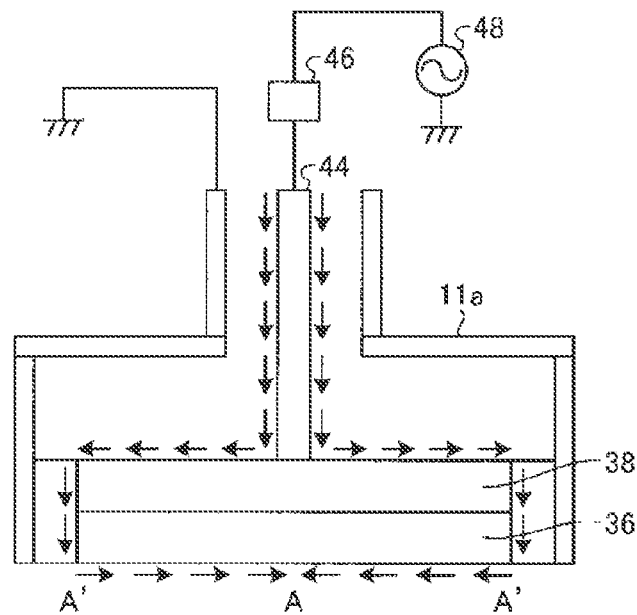
FIG. 6 is a view schematically illustrating an example of a supply route of radio-frequency power in an upper electrode.
Figure 7:
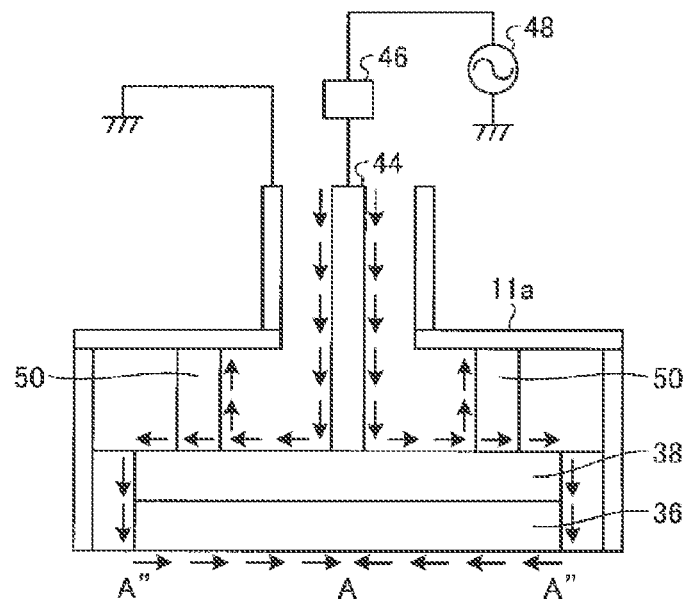
FIG. 7 is a view schematically illustrating an example of the supply route of radio-frequency power in the upper electrode.

FIG. 6 and FIG. 7 are views schematically illustrating examples of a supply route of radio-frequency power in the upper electrode. FIG. 6 illustrates an example of the supply route of the radio-frequency power, in a cross section taken along the line A'-A-A' illustrated in FIG. 4, that is, in a cross section of a portion where the dielectrics 50 are not present. As illustrated in FIG. 6, the radio-frequency power supplied to the feeding rod 44 from the radio-frequency power supply 48 via the matcher 46 reaches the bottom surface of the top plate 36, as a plasma contact surface, through the surface of the feeding rod 44, the top surface of the base member 38, the side surface of the base member 38, and the side surface of the top plate 36, due to a skin effect. In this case, since the feeding rod 44 is present at the center of the base member 38 in the shower head 34 that is the upper electrode, the voltage and the current have the same phases everywhere at the edge portion on the bottom surface of the top plate 36, and power is gradually supplied in the same phase from the edge portion of the top plate 36 toward the center.

FIG. 7 illustrates an example of the supply route of the radio-frequency power, in a cross section taken along the line A"-A-A" illustrated in FIG. 4, that is, in a cross section of a portion where the dielectrics 50 are present. As illustrated in FIG. 7, the radio-frequency power supplied to the feeding rod 44 from the radio-frequency power supply 48 via the matcher 46 reaches the bottom surface of the top plate 36, as a plasma contact surface, through the surface of the feeding rod 44, the top surface of the base member 38, the side surface of the base member 38, and the side surface of the top plate 36, due to a skin effect. However, since the dielectrics 50 are present on the top surface of the base member 38, a part of the radio-frequency power flows to the grounded plate-shaped member 11*a* through the dielectrics 50. Therefore, in the portion where the dielectrics 50 are present, the radio-frequency power reaching the edge portion on the bottom surface of the top plate 36 is different from that in the portion where the dielectrics 50 are not present as illustrated in FIG. 6.

Figure 8:
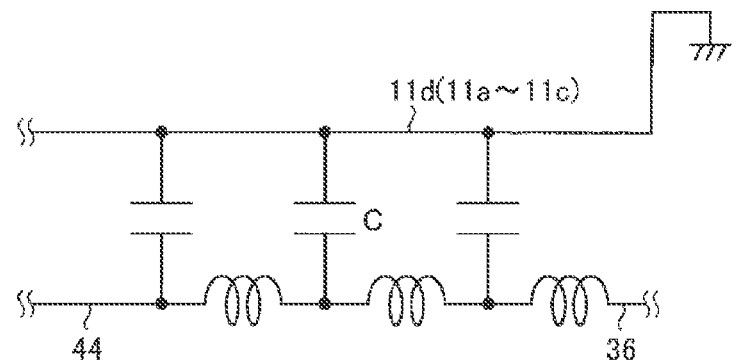
FIG. 8 is a view illustrating an example of an equivalent circuit from a feeding rod to a top plate.

FIG. 8 is a view illustrating an example of an equivalent circuit from the feeding rod to the top plate. As illustrated in FIG. 8, the equivalent circuit of the supply route of the radio-frequency power from the feeding rod 44 to the top plate 36 may be represented by a state where a large number of capacitors are formed in parallel between a route from the feeding rod 44 to the top plate 36, and the cover member 11*d*. Here, for example, when the capacitor corresponding to the top surface of the base member 38 is assumed to be a capacitor C, the capacitance of the capacitor C changes depending on presence/absence of the dielectrics 50. Therefore, when the arrangement of the dielectrics 50 is biased, generated plasma is largely biased.

[Bias of Plasma According to Arrangement of Dielectrics 50]

Figure 9:
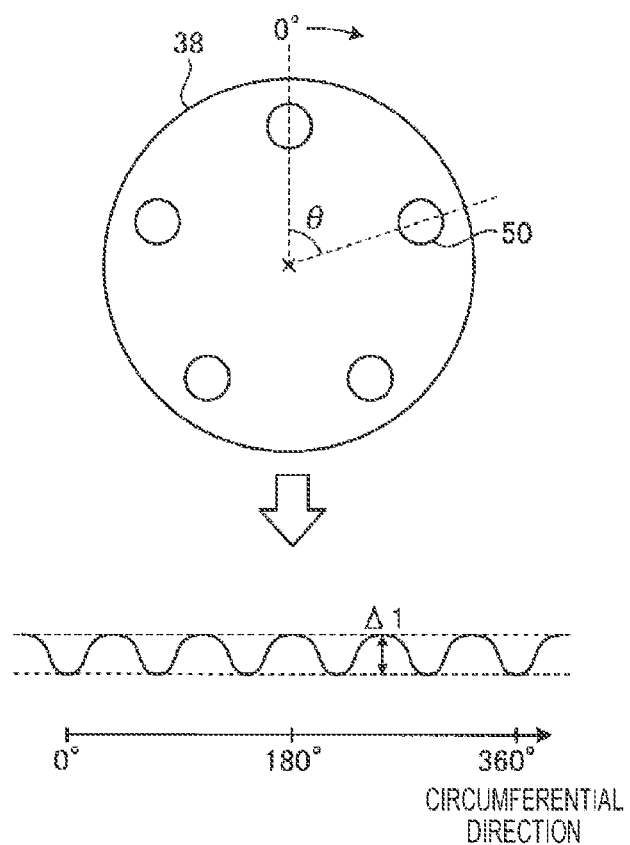
FIG. 9 is a view illustrating an example of plasma bias in a case where the dielectrics are evenly arranged in the circumferential direction in the first embodiment.

FIG. 9 is a view illustrating an example of plasma bias in a case where the dielectrics are evenly arranged in the circumferential direction in the first embodiment. As illustrated in FIG. 9, a difference in the plasma density in a case where the five dielectrics 50 are evenly arranged on the circumference is taken as an example of plasma bias in the first embodiment. In FIG. 9, the dielectric 50 is arranged at each central angle (θ). Here, the plasma density in the circumferential direction of the edge of the wafer W is reduced by Δ1 at places where the dielectrics 50 are present. The edge of the wafer W is a region 145 to 150 mm from the center of the 300-mm wafer.

Figure 10:
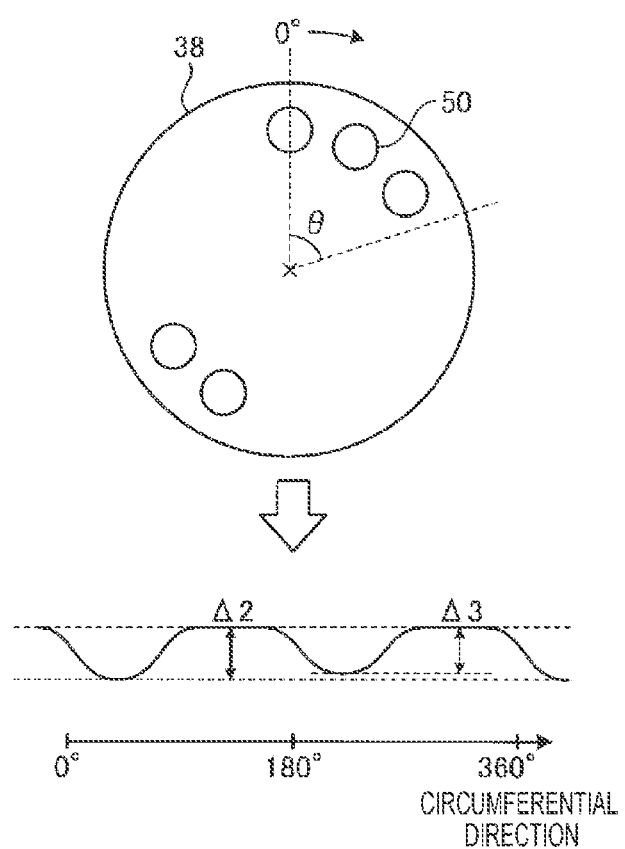
FIG. 10 is a view illustrating an example of plasma bias in a case where the dielectrics are unevenly arranged in the circumferential direction in Comparative Example.

FIG. 10 is a view illustrating an example of plasma bias in a case where the dielectrics are unevenly arranged in the circumferential direction in Comparative Example. In Comparative Example illustrated in FIG. 10, a difference in the plasma density in a case where among the five dielectrics 50, two dielectrics and three dielectrics are separately arranged on the circumference is taken as an example. In FIG. 10, the dielectrics 50 are unevenly arranged such that three are arranged in the range of the central angle (θ) and two are arranged on the opposite side. Here, the plasma density in the circumferential direction of the edge of the wafer W is reduced by Δ2 in a region where the three dielectrics 50 are arranged, and is reduced by Δ3 in a region where the two dielectrics 50 are arranged. As illustrated in FIG. 9 and FIG. 10, when differences in the plasma density depending on the presence/absence of the dielectrics 50, that is, Δ1 and Δ2/Δ3, are compared to each other, it is found that Δ1 in a case where the dielectrics 50 are evenly arranged is smaller than Δ2/Δ3 in a case where the dielectrics 50 are unevenly arranged. This is because when the dielectrics 50 are arranged together in a specific region, the impedance in the corresponding region becomes high, and then a boundary against a region where the dielectrics 50 are not arranged becomes high.

If a material having a relative permittivity (in the case of PTFE, εr=2.1) close to a relative permittivity of a location (a space) where the dielectrics 50 are not present, that is, a dielectric permittivity (εr=1.0) of atmosphere in the first embodiment, can be used for the dielectrics 50, the difference (Δ1) in the plasma density depending on the presence/absence of the dielectrics 50 becomes smaller, and then plasma with higher uniformity of plasma density can be generated.

Figure 11:
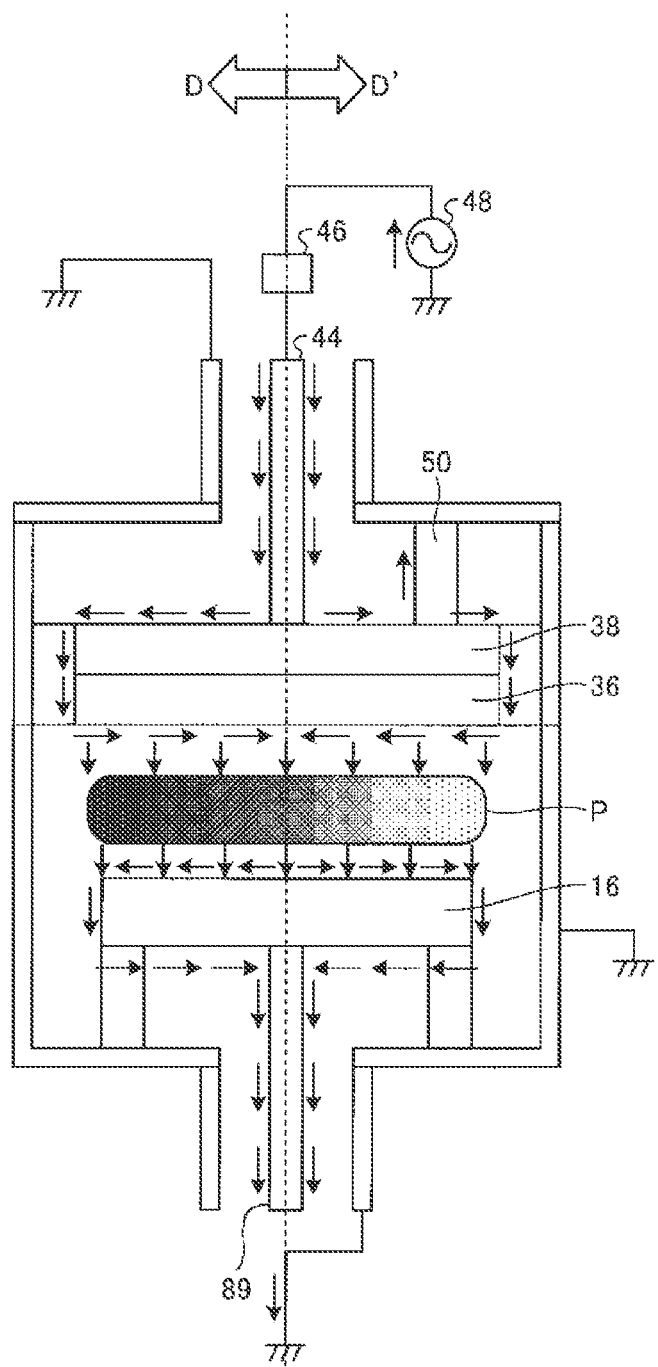
FIG. 11 is a view schematically illustrating an example of the supply route of radio-frequency power depending on the presence/absence of the dielectrics in the first embodiment.

FIG. 11 is a view schematically illustrating an example of the supply route of the radio-frequency power depending on the presence/absence of the dielectrics in the first embodiment. FIG. 11 schematically illustrates the supply route of the radio-frequency power depending on the presence/absence of the dielectrics 50, and the plasma density. A region D in FIG. 11 is a region where the dielectrics 50 are not present, and a region D' is a region where the dielectrics 50 are present. As illustrated in FIG. 11, in the region D, the radio-frequency power supplied to the feeding rod 44 from the radio-frequency power supply 48 via the matcher 46 reaches the bottom surface of the top plate 36 as the plasma contact surface through the surface of the feeding rod 44, the top surface of the base member 38, the side surface of the base member 38, and the side surface of the top plate 36. The plasma P of the processing gas is generated by the supplied radio-frequency power in the processing space as the plasma generation space, and the radio-frequency power reaches the stage 16 as the lower electrode, and flows to the ground through the feeding rod 89. In FIG. 11, the radio-frequency power supply 88 for bias and the matcher 87 are omitted.

Meanwhile, in the region D', the radio-frequency power reaches the bottom surface of the top plate 36 as the plasma contact surface through the surface of the feeding rod 44, the top surface of the base member 38, the side surface of the base member 38, and the side surface of the top plate 36. Before the radio-frequency power reaches the bottom surface of the top plate 36 facing the processing space, a part of the radio-frequency power flows to the ground through the dielectrics 50. The plasma P of the processing gas is generated by the supplied radio-frequency power in the processing space, and the radio-frequency power reaches the stage 16 as the lower electrode, and flows to the ground through the feeding rod 89. That is, in the region D and the region D', a difference in the impedance occurs between the radio-frequency power supply 48—the plasma P—the ground. That is, with a focus on the plasma P, the plasma density becomes dark in the region D, and the plasma density becomes light in the region D'.

[Influence on Etching Rate]

Figure 12:
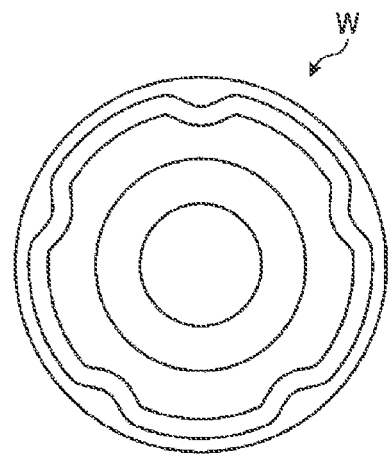
FIG. 12 is a view illustrating an example of etching rate distribution in a case where the dielectrics are evenly arranged in the circumferential direction in the first embodiment.

FIG. 12 is a view illustrating an example of etching rate distribution in a case where the dielectrics are evenly arranged in the circumferential direction in the first embodiment. FIG. 12 illustrates an example of etching rate distribution in a case where the five dielectrics 50 are evenly arranged on the circumference as illustrated in FIG. 9. As illustrated in FIG. 12, the etching rate distribution in the wafer W is a distribution that is slightly recessed inward in regions where the dielectrics 50 are present, but generally has high uniformity.

Figure 13:
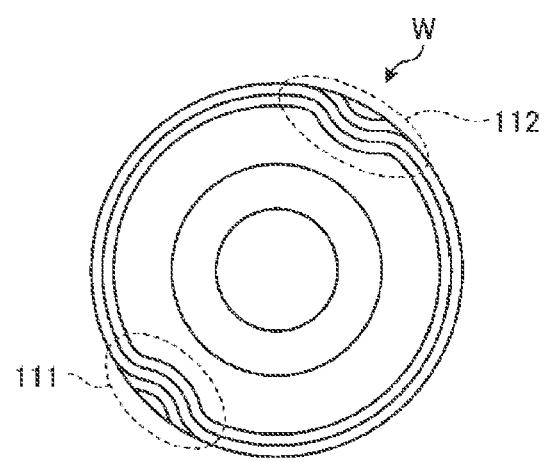
FIG. 13 is a view illustrating an example of etching rate distribution in a case where the dielectrics are unevenly arranged in the circumferential direction in Comparative Example.

FIG. 13 is a view illustrating an example of etching rate distribution in a case where the dielectrics are unevenly arranged in the circumferential direction in Comparative Example. FIG. 13 illustrates an example of etching rate distribution in a case where among the five dielectrics 50, the two dielectrics 50 and the three dielectrics 50 are separately arranged on the circumference as illustrated in FIG. 10. As illustrated in FIG. 13, the etching rate distribution in the wafer W is a distribution that is locally largely recessed inward in regions 112 and 113 corresponding to regions where the dielectrics 50 are present. Therefore, in the first embodiment, by evenly arranging the dielectrics 50, it is possible to generate plasma with high uniformity in the circumferential direction of the outer periphery of the electrode, and to increase the uniformity of etching rates.

Modification of First Embodiment

Figure 14:
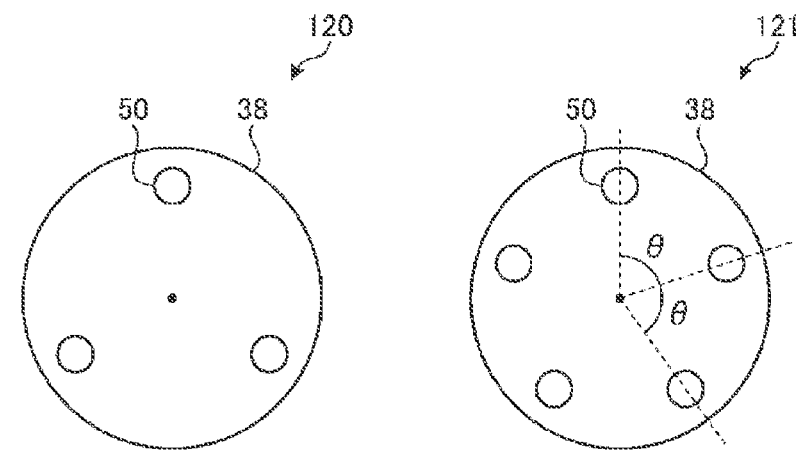
FIG. 14 is a view illustrating examples of the arrangement in a case where an odd number of dielectrics are arranged in the first embodiment.

Here, descriptions will be made on modifications of the arrangement of the dielectrics 50 in the first embodiment by using FIGS. 14 to 17. FIG. 14 is a view illustrating examples of the arrangement in a case where an odd number of dielectrics are arranged in the first embodiment. An arrangement example 120 illustrated in FIG. 14 is an example where the three dielectrics 50 are evenly arranged on one circumference on the base member 38. An arrangement example 121 is an example where the five dielectrics 50 are evenly arranged on one circumference on the base member 38. The arrangement example 121 is the same as the arrangement in FIG. 9, and each dielectric 50 is arranged at each central angle (θ). In the example of the odd-number arrangement, the number is not limited as long as the number is three or more, and more dielectrics 50 (e.g., seven or nine) may be arranged. When an odd number of dielectrics 50 are arranged, a rotational symmetric arrangement is made.

Figure 15:
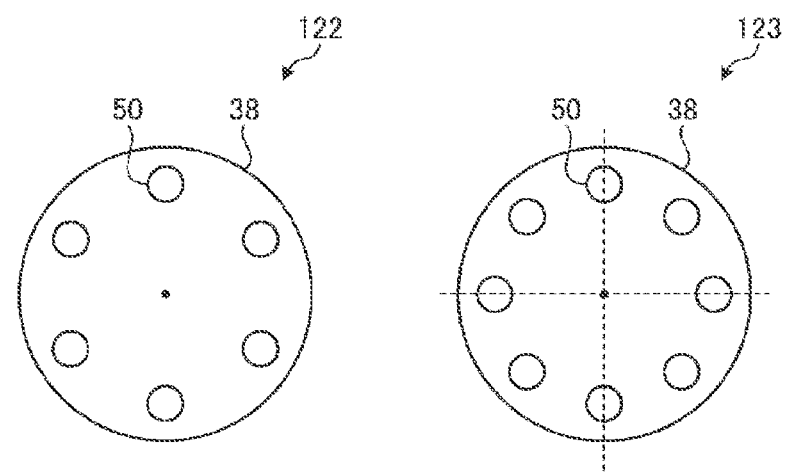
FIG. 15 is a view illustrating examples of the arrangement in a case where an even number of dielectrics are arranged in the first embodiment.

FIG. 15 is a view illustrating examples of the arrangement in a case where an even number of dielectrics are arranged in the first embodiment. An arrangement example 122 illustrated in FIG. 15 is an example where the six dielectrics 50 are evenly arranged on one circumference on the base member 38. An arrangement example 123 is an example where the eight dielectrics 50 are evenly arranged on one circumference on the base member 38. In the example of the even-number arrangement, the number is not limited as long as the number is four or more, and more dielectrics 50 (e.g., 10 or 12) may be arranged. When an even number of dielectrics 50 are arranged, the dielectrics 50 are axisymmetrically arranged, and are rotationally symmetrically arranged as in the case where an odd number of dielectrics are arranged.

Figure 16:
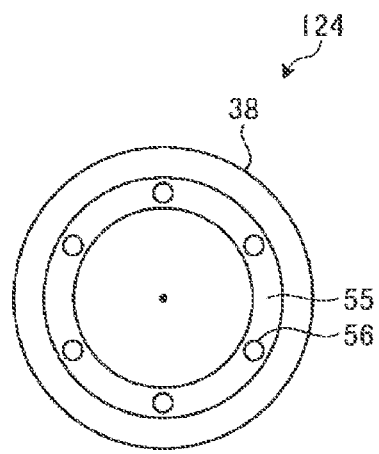
FIG. 16 is a view illustrating an example in a case where a ring-shaped dielectric is arranged in the first embodiment.

FIG. 16 is a view illustrating an example in a case where a ring-shaped dielectric is arranged in the first embodiment. An arrangement example 124 illustrated in FIG. 16 is an example where a plurality of through holes 56 is provided in a ring-shaped dielectric 55 instead of the dielectric 50, and the through holes 56 are evenly arranged on one circumference. An odd number of through holes 56 are rotationally symmetrically arranged, and an even number of through holes 56 are axisymmetrically arranged. The dielectric 55 is arranged such that the center of the dielectric 55 coincides with the center of the base member 38 (the center of the upper electrode). The dielectric 55 may have a plate shape having a wide radial width.

Figure 17:
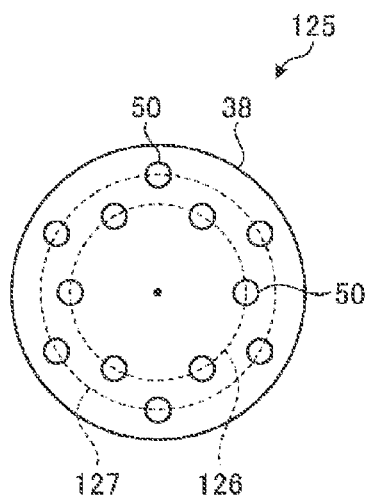
FIG. 17 is a view illustrating an example of the arrangement in a case where the dielectrics are arranged on a plurality of circumferences in the first embodiment.

FIG. 17 is a view illustrating an example of the arrangement in a case where the dielectrics are arranged on a plurality of circumferences in the first embodiment. An arrangement example 125 illustrated in FIG. 17 is an example where the six dielectrics 50 are evenly arranged on each of two circumferences 126 and 127 on the base member 38. In this case, the dielectrics 50 are rotationally symmetrically or axisymmetrically arranged on each of the circumferences 126 and 127. The number of dielectrics 50 on each of the circumferences 126 and 127 is not limited as long as the number is three or more in the odd-number arrangement, or is four or more in the even-number arrangement. In FIGS. 14, 15 and 17, as the number of dielectrics 50 increases, plasma with higher uniformity may be generated in the circumferential direction of the outer periphery of the electrode.

Second Embodiment

In the first embodiment, the cylindrical dielectrics 50 are connected toward the introduction ports in the plate-shaped member 11a from the base member 38, and are connected to the pipes 64 and 93. On the other hand, introduction ports may be provided in the wall member 11c, to which the pipes 64 and 93 may be connected. An embodiment in this case will be described as a second embodiment. The same configurations as those in the first embodiment will be denoted by the same reference numerals, and descriptions of the redundant configurations and operations will be omitted.

[Configuration of Plasma Processing Apparatus 2]

Figure 18:
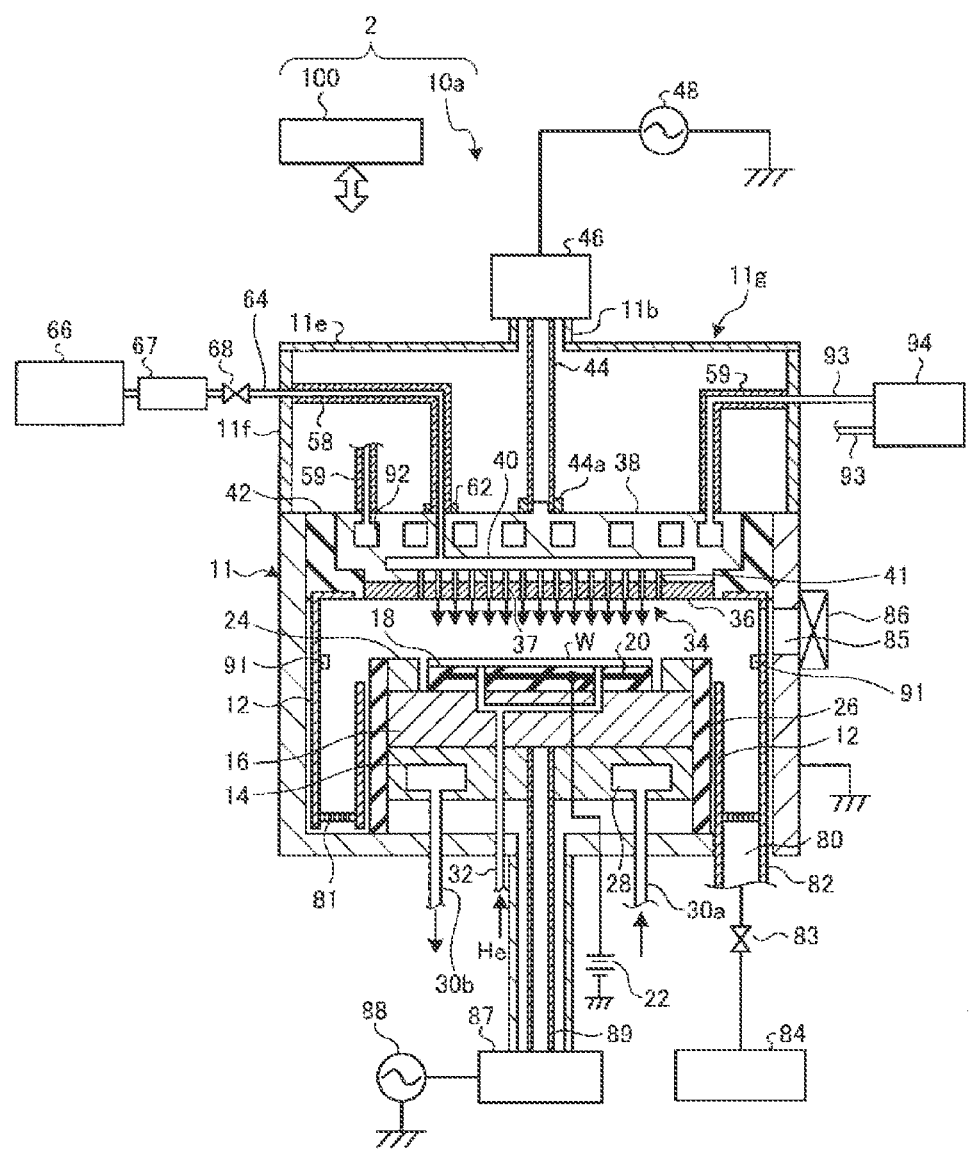
FIG. 18 is a view illustrating an example of a plasma processing apparatus in a second embodiment of the present disclosure.

FIG. 18 is a view illustrating an example of a plasma processing apparatus in the second embodiment of the present disclosure. A plasma processing apparatus 2 illustrated in FIG. 18 includes a device main body 10a instead of the device main body 10 unlike the plasma processing apparatus 1 of the first embodiment. The device main body 10a includes a cover member 11g, and dielectrics 58 and 59 instead of the cover member 11d, and the dielectrics 51 and 52, unlike the device main body 10. In the following descriptions, the dielectrics 58 and 59 not distinguished from each other and a dummy dielectric are referred to as dielectrics 57.

The cover member 11g includes a plate-shaped member 11e, the tubular member 11b, and a wall member 11f. The plate-shaped member 11e corresponds to the plate-shaped member 11a in the first embodiment, but does not include the introduction ports for the pipes 64 and 93. The wall member 11f corresponds to the wall member 11c in the first embodiment, and includes introduction ports for the pipes 64 and 93. That is, the cover member 11g is a cover member in which pipes for the processing gas or the coolant are introduced from the side surface.

The dielectric 58 has a through hole, and is bent so that surfaces at both ends differ by 90 degrees. One end of the dielectric 58 is connected to the introduction port 62 in the base member 38. One end of the pipe 64 is connected to the other end of the dielectric 58 through an introduction port provided in the wall member 11f.

Like the dielectric 58, the dielectric 59 has a through hole, and is bent so that surfaces at both ends differ by 90 degrees. One end of the dielectric 59 is connected to the flow path 92 in the base member 38. The pipe 93 is connected to the other end of the dielectric 59 via an introduction port provided in the wall member 11f. The heights of the dielectrics 58 and 59 and the pipes 64 and 93 are the same, and also the heights of the introduction ports provided in the wall member 11f are the same.

[Arrangement and Shape of Dielectrics 57]

Figure 19:
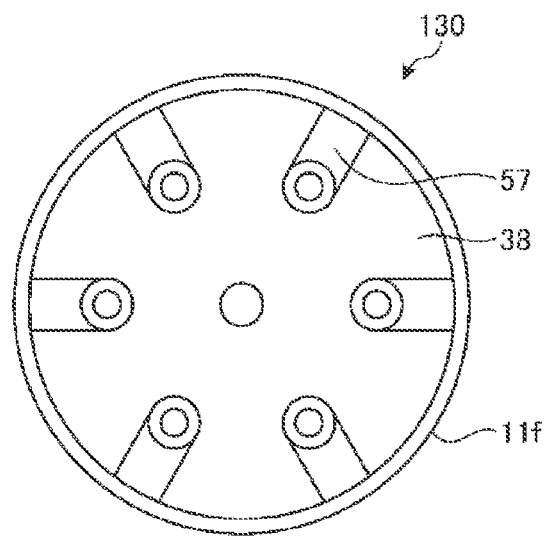
FIG. 19 is a plan view illustrating an example of the arrangement of dielectrics on the upper portion of a chamber in the second embodiment.

Next, the arrangement and the shape of the dielectrics 57 will be described by using FIGS. 19 to 22. FIGS. 19 to 22 are plan views illustrating examples of the arrangement of the dielectrics on the upper portion of the chamber in the second embodiment. An arrangement example 130 illustrated in FIG. 19 is an example where one ends of the six dielectrics 57 are evenly arranged on one circumference on the base member 38, and the other ends of the dielectrics 57 are connected to the introduction ports in the wall member 11f. In the arrangement example 130, in the top view, the dielectrics 57 are connected while being in contact with the wall member 11f at right angles.

Figure 20:
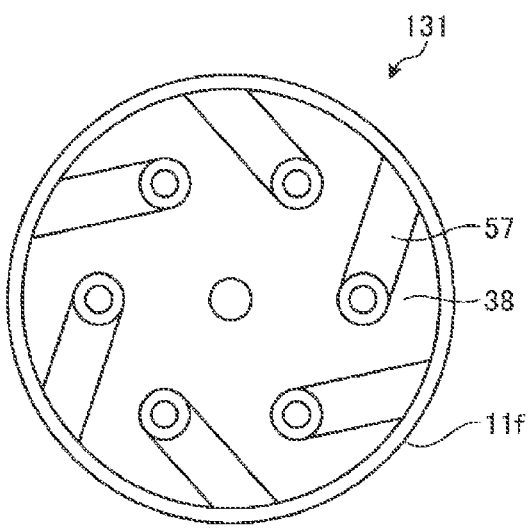
FIG. 20 is a plan view illustrating an example of the arrangement of the dielectrics on the upper portion of the chamber in the second embodiment.

An arrangement example 131 illustrated in FIG. 20 is a modification of the arrangement of the dielectrics 57. The arrangement example 131 is an example where one ends of the six dielectrics 57 are evenly arranged on one circumference on the base member 38, and the other ends of the dielectrics 57 are connected to the introduction ports in the wall member 11f. In the arrangement example 131, in the top view, the dielectrics 57 are connected while being in oblique contact with the wall member 11f. The angle at which the dielectric 57 is in contact with the wall member 11f may be any angle. However, it is desirable that the angles at which all the dielectrics 57 are in contact with the wall member 11f are same or similar so that the rotational symmetry is obtained.

Figure 21:
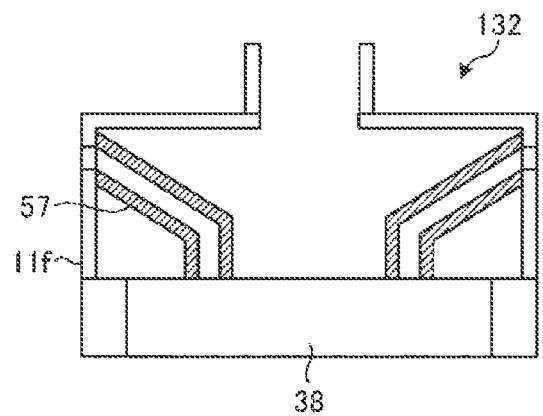
FIG. 21 is a sectional view illustrating an example of the arrangement of the dielectrics on the upper portion of the chamber in the second embodiment.

An arrangement example 132 illustrated in FIG. 21 illustrates an example of the shape of the dielectric 57. In the arrangement example 132, the dielectric 57 is formed into a substantially L shape. The angle of the substantially L-shaped bent portion in the shape of the dielectric 57 may be any angle. However, it is desirable that the angles of the substantially L-shaped bent portions in the shapes of the dielectrics 57 are same or similar so that the rotational symmetry is obtained.

Figure 22:
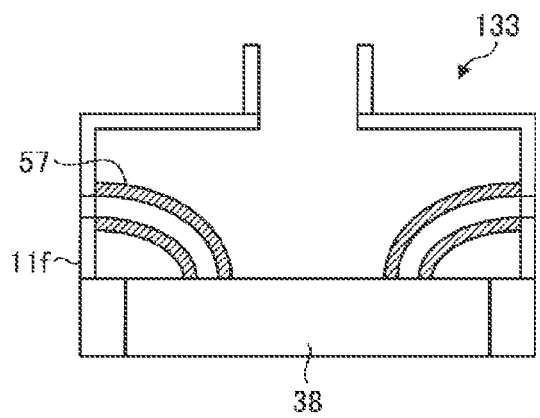
FIG. 22 is a sectional view illustrating an example of the arrangement of the dielectrics on the upper portion of the chamber in the second embodiment.

An arrangement example 133 illustrated in FIG. 22 is a modification of the shape of the dielectric 57. In the arrangement example 133, the dielectric 57 is formed into an arc shape. For example, the curve radius of the arc in the shape of the dielectric 57 may have any value. However, it is desirable that, for example, the curve radii of the arcs in the shapes of the dielectrics 57 are same or similar so that the rotational symmetry is obtained.

As described above, in the second embodiment as well as in the first embodiment, by evenly arranging the dielectrics 57, it is possible to generate plasma with high uniformity in the circumferential direction of the outer periphery of the electrode, and to increase the uniformity of etching rates.

Third Embodiment

In the first embodiment, the radio-frequency power supply 48 for plasma generation is connected to the shower head 34 that is the upper electrode, but may be connected to the stage 16 that is the lower electrode. An embodiment in this case will be described as a third embodiment. The same configurations as those in the first embodiment will be denoted by the same reference numerals, and descriptions of the redundant configurations and operations will be omitted.

[Configuration of Plasma Processing Apparatus 3]

Figure 23:
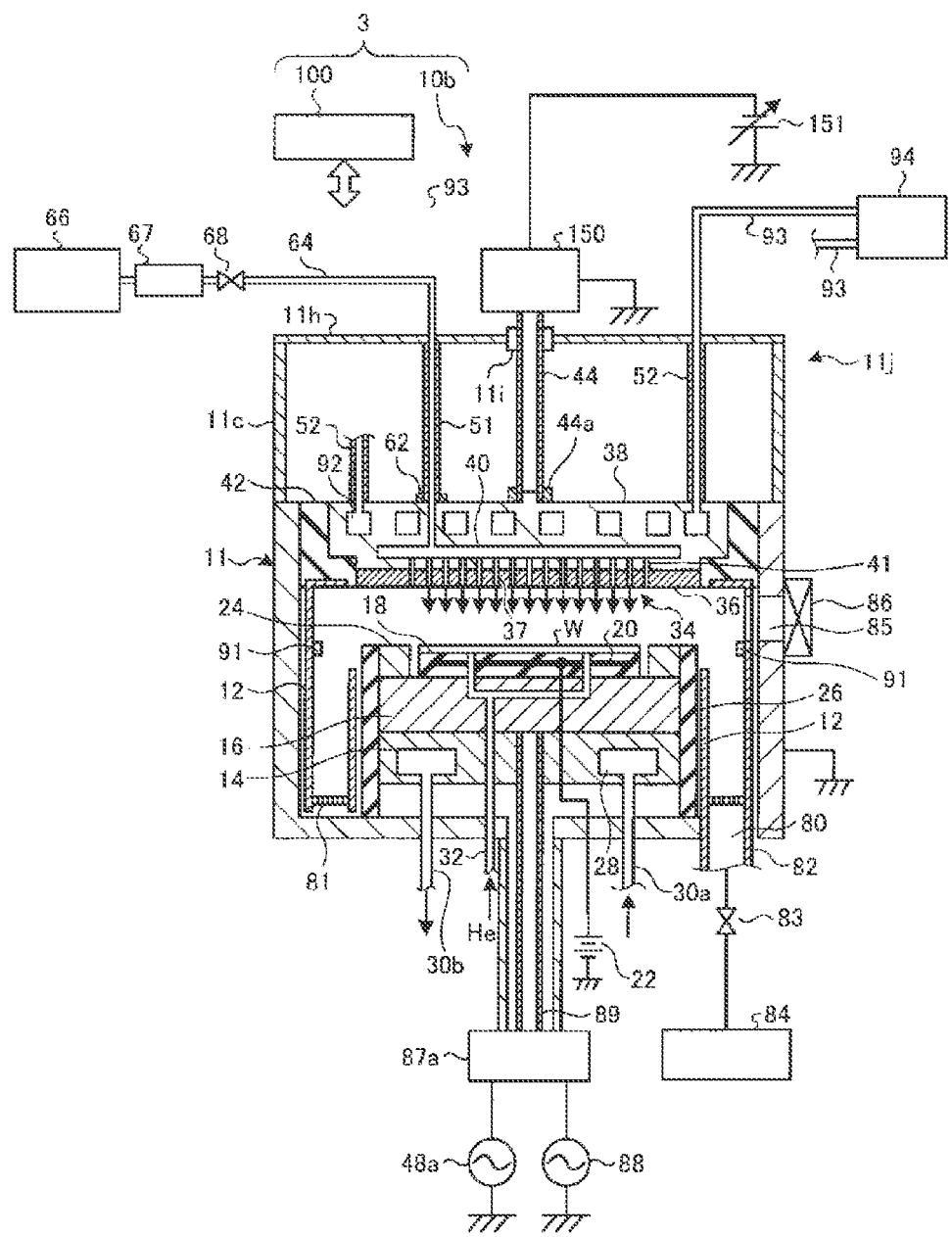
FIG. 23 is a view illustrating an example of a plasma processing apparatus in a third embodiment of the present disclosure.

FIG. 23 is a view illustrating an example of a plasma processing apparatus in the third embodiment of the present disclosure. A plasma processing apparatus 3 illustrated in FIG. 23 includes a device main body 10*b* instead of the device main body 10 unlike the plasma processing apparatus 1 of the first embodiment. The device main body 10*b* includes a cover member 11*j*, a low-pass filter (LPF) 150, a DC power supply 151, a radio-frequency power supply 48*a*, and a matcher 87*a* instead of the cover member 11*d*, the matcher 46, the radio-frequency power supply 48, and the matcher 87 unlike the device main body 10.

The cover member 11*j* includes a plate-shaped member 11*h*, the wall member 11*c*, and an insulating member 11*i*. The plate-shaped member 11*h* corresponds to the plate-shaped member 11*a* in the first embodiment, but is different from the plate-shaped member 11*a* in that the plate-shaped member 11*h* is connected to the feeding rod 44 through the insulating member 11*i*.

The DC power supply 151 applies a DC voltage to the base member 38 via the LPF 150 and the feeding rod 44. That is, the DC power supply 151 applies a DC voltage to the shower head 34 as the upper electrode. The LPF 150 is grounded in a radio-frequency manner. The radio-frequency power supply 48*a* supplies radio-frequency power for plasma generation, to the stage 16 as the lower electrode via the matcher 87*a* and the feeding rod 89. The radio-frequency power supply 88 is also connected to the matcher 87*a*. As in the first embodiment, the radio-frequency power supply 88 supplies radio-frequency power for bias, to the stage 16 through the matcher 87*a* and the feeding rod 89. That is, in the device main body 10*b* of the third embodiment, the stage 16 as the lower electrode serves as an RF application electrode for plasma generation, and the shower head 34 as the upper electrode serves as the opposite ground (GND) electrode.

[Supply Route of Radio-Frequency Power and Plasma Density]

Figure 24:
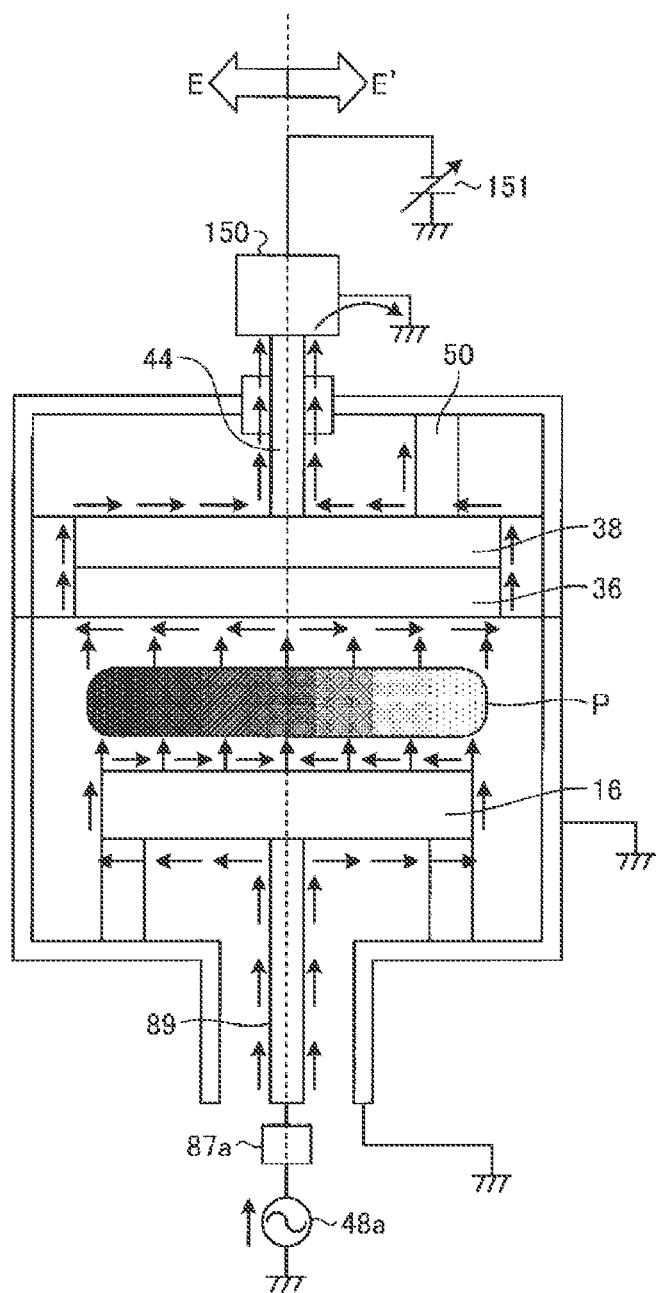
FIG. 24 is a view schematically illustrating an example of a supply route of radio-frequency power depending on the presence/absence of dielectrics in the third embodiment.

FIG. 24 is a view schematically illustrating an example of the supply route of the radio-frequency power depending on the presence/absence of the dielectrics in the third embodiment. FIG. 24 schematically illustrates the supply route of the radio-frequency power depending on the presence/absence of the dielectrics 50, and the plasma density. A region E in FIG. 24 is a region where the dielectrics 50 are not present, and a region E is a region where the dielectrics 50 are present. As illustrated in FIG. 24, in the region E, the radio-frequency power supplied to the feeding rod 89 from the radio-frequency power supply 48*a* via the matcher 87*a* reaches the front surface of the stage 16 as the plasma contact surface through the back surface of the stage 16 and the side surface of the stage 16. The plasma P of the processing gas is generated by the supplied radio-frequency power in the processing space, and the radio-frequency power reaches the bottom surface of the top plate 36. The radio-frequency power flows to the ground via the LPF 150 through the bottom surface of the top plate 36, the side surface of the top plate 36, the side surface of the base member 38, the top surface of the base member 38, and the surface of the feeding rod 44.

Meanwhile, in the region E', the radio-frequency power reaches the front surface of the stage 16 as the plasma contact surface through the back surface of the stage 16 and the side surface of the stage 16. The plasma P of the processing gas is generated by the supplied radio-frequency power in the processing space, and the radio-frequency power reaches the bottom surface of the top plate 36. The radio-frequency power flows to the ground via the LPF 150 through the bottom surface of the top plate 36, the side surface of the top plate 36, the side surface of the base member 38, the top surface of the base member 38, and the surface of the feeding rod 44. On the top surface of the base member 38, before the radio-frequency power reaches the feeding rod 44, a part of the radio-frequency power flows to the ground through the dielectrics 50. That is, in the region E and the region E, a difference in the impedance occurs between the radio-frequency power supply 48*a*—the plasma P—the ground. That is, with a focus on the plasma P, the plasma density becomes dark in the region E, and the plasma density becomes light in the region E'.

As described above, in the third embodiment as well as in the first embodiment, by evenly arranging the dielectrics 50, it is possible to generate plasma with high uniformity in the circumferential direction of the outer periphery of the electrode, and to increase the uniformity of etching rates.

As described above, according to each of the above-described embodiments, the plasma processing apparatus 1 includes the chamber 11, the first electrode (the shower head 34), the radio-frequency power supply 48, the feeding rod 44, the plate-shaped member 11*a*, and the dielectric. The first electrode is an electrode facing the inside of the chamber 11. The radio-frequency power supply 48 supplies radio-frequency power to the first electrode. The feeding rod 44 feeds the radio-frequency power to the center of a surface of the first electrode opposite to a surface facing the inside of the chamber 11. The plate-shaped member 11*a* is a grounded conductive plate-shaped member that is provided in parallel to the surface of the first electrode opposite to the surface facing the inside of the chamber 11. The dielectric connects the first electrode to the plate-shaped member 11*a*, and has a shape that is rotationally symmetric with respect to the center of the first electrode. As a result, it is possible to generate plasma with high uniformity in the circumferential direction of the outer periphery of the electrode.

According to each of the above-described embodiments, the dielectric has a through hole that connects a space (the diffusion chamber 40 and the flow path 92) provided within the first electrode, to the pipes 64 and 93 connected to the outside of the plate-shaped member 11a. As a result, the processing gas may be supplied to the shower head 34, and the temperature of the base member 38 and the shower head 34 may be adjusted by the coolant.

According to each of the above-described embodiments, the dielectric has a plurality of portions (the dielectrics 50) having the same shapes and materials, in which the portions have through holes, respectively, and are arranged rotationally symmetrically with respect to the center of the first electrode. As a result, it is possible to generate plasma with high uniformity in the circumferential direction of the outer periphery of the electrode.

According to a modification of the first embodiment, the dielectric is a ring-shaped member (the dielectric 55), and is arranged such that the center of the ring-shaped member coincides with the center of the first electrode. As a result, it is possible to generate plasma with high uniformity in the circumferential direction of the outer periphery of the electrode.

According to a modification of the first embodiment, the ring-shaped member has a plurality of through holes 56, and the through holes 56 are provided rotationally symmetrically with respect to the center of the first electrode. As a result, it is possible to generate plasma with high uniformity in the circumferential direction of the outer periphery of the electrode.

According to each of the above-described embodiments, the through hole allows the processing gas supplied into the chamber 11 to flow. As a result, it is possible to supply the processing gas to the shower head 34.

According to each of the above-described embodiments, the plurality of through holes is provided in the dielectric, and includes a dummy through hole that does not allow the processing gas to flow. As a result, it is possible to generate plasma with high uniformity in the circumferential direction of the outer periphery of the electrode.

According to each of the above-described embodiments, the plurality of through holes is provided in the dielectric, and a through hole different from the through hole that allows the processing gas to flow allows the coolant supplied to the space provided within the first electrode to flow. As a result, it is possible to adjust the temperature of the base member 38 and the shower head 34 by the coolant.

According to each of the above-described embodiments, the plurality of through holes includes a dummy through hole that does not allow the processing gas and the coolant supplied to the space provided within the first electrode to flow. As a result, it is possible to generate plasma with high uniformity in the circumferential direction of the outer periphery of the electrode.

According to each of the above-described embodiments, the through hole allows the coolant supplied to the space provided within the first electrode to flow. As a result, it is possible to adjust the temperature of the base member 38 and the shower head 34 by the coolant.

According to each of the above-described embodiments, the plurality of through holes is provided in the dielectric, and includes a dummy through hole that does not allow the coolant supplied to the space provided within the first electrode to flow. As a result, it is possible to generate plasma with high uniformity in the circumferential direction of the outer periphery of the electrode.

According to the third embodiment, the plasma processing apparatus 3 includes the chamber 11, the first electrode (the shower head 34), the second electrode (the stage 16), the radio-frequency power supply 48a, the feeding rod 44, the plate-shaped member 11h, and the dielectric. The first electrode faces the inside of the chamber 11. The second electrode is provided while facing the first electrode within the chamber 11. The radio-frequency power supply 48a supplies radio-frequency power to the second electrode. The feeding rod 44 applies a DC voltage to the center of a surface of the first electrode opposite to a surface facing the inside of the chamber 11. The plate-shaped member 11h is a grounded conductive plate-shaped member that is provided in parallel to the surface of the first electrode opposite to the surface facing the inside of the chamber 11. The dielectric connects the first electrode to the plate-shaped member 11h, and has a shape that is rotationally symmetric with respect to the center of the first electrode. As a result, it is possible to generate plasma with high uniformity in the circumferential direction of the outer periphery of the electrode.

According to the third embodiment, the first electrode is grounded at the frequency of the radio-frequency power supplied to the second electrode. As a result, it is possible to generate plasma with high uniformity in the circumferential direction of the outer periphery of the electrode.

According to the third embodiment, the plasma processing apparatus 3 further includes the DC power supply 151 that applies the DC voltage to the first electrode via the feeding rod. As a result, it is possible to generate plasma with high uniformity in the circumferential direction of the outer periphery of the electrode.

In each of the above-described embodiments, the number of diffusion chambers for the processing gas is one or two, but the present disclosure is not limited thereto. For example, three or four diffusion chambers may be provided, and the dielectrics 50 which supply the processing gas to the diffusion chambers, respectively, may be provided.

In each of the above-described embodiments, there is one flow path for the chiller coolant, but the present disclosure is not limited thereto. For example, two or more flow paths for the coolant may be provided, and the dielectrics 50 which supply the coolant to the flow paths, respectively, may be provided.

In each of the above-described embodiments, the effect in the supply route of the radio-frequency power for plasma generation has been described, but the present disclosure is not limited thereto. For example, by rotationally symmetrically arranging the dielectrics in the supply route of the radio-frequency power for bias, it can be expected that ions with high uniformity can be attracted on the wafer.

In each of the above-described embodiments, the through hole of the dielectric 50 allows the processing gas or the chiller coolant to flow or becomes a dummy through hole, but the present disclosure is not limited thereto. For example, the through hole of the dielectric 50 may be used as a passage of an optical fiber for measuring the temperature of the base member 38 and the top plate 36 or an optical path of laser light. When a heater is embedded within the base member 38 to adjust the temperature of the base member 38 and the top plate 36, the through hole may be used as a passage of wiring connected to the heater.

In each of the above-described embodiments, the space covered by the cover member is set to be under atmospheric pressure, but the present disclosure is not limited thereto. For example, the space covered by the cover member may be depressurized to a vacuum state by a vacuum pump. Accordingly, even when a chiller coolant having a temperature lower than a dew point is used, it is possible to suppress the generation of dew condensation in the space covered by the cover member.

According to the present disclosure, it is possible to generate plasma with high uniformity in the circumferential direction of the outer periphery of the electrode.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber;
a first electrode facing an inside of the chamber;
a radio-frequency power supply configured to supply a radio-frequency power to the first electrode;
a feeding rod configured to feed the radio-frequency power to a center of a surface of the first electrode opposite to a surface facing the inside of the chamber;
a conductive plate provided in parallel to the surface of the first electrode opposite to the surface facing the inside of the chamber, the plate being grounded; and
a dielectric connecting the first electrode and the conductive plate, and having a shape that is rotationally symmetric with respect to the center of the first electrode,
wherein the dielectric has a through hole that connects a space provided within the first electrode, and a pipe connected to outside of the conductive plate.

2. The plasma processing apparatus according to claim 1, wherein the dielectric has a plurality of portions each having the through hole, and the plurality of portions have the same shape and materials and are arranged rotationally symmetrically with respect to the center of the first electrode.

3. The plasma processing apparatus according to claim 1, wherein the dielectric is a ring-shaped member, and is arranged such that a center of the ring-shaped member coincides with the center of the first electrode.

4. The plasma processing apparatus according to claim 3, wherein the ring-shaped member has a plurality of through holes, and the plurality of through holes are provided rotationally symmetrically with respect to the center of the first electrode.

5. The plasma processing apparatus according to claim 1, wherein the through hole allows a processing gas supplied into the chamber to flow therethrough.

6. The plasma processing apparatus according to claim 5, wherein the dielectric has a plurality of through holes including a dummy through hole that does not allow the processing gas to flow therethrough.

7. The plasma processing apparatus according to claim 6, wherein the plurality of through holes includes a dummy through hole that does not allow the processing gas and a coolant supplied to the space provided within the first electrode to flow therethrough.

8. The plasma processing apparatus according to claim 5, wherein the dielectric has a plurality of through holes, and a through hole different from the through hole that allows the processing gas to flow therethrough allows a coolant supplied to the space provided within the first electrode to flow therethrough.

9. The plasma processing apparatus according to claim 1, wherein the through hole allows a coolant supplied to the space provided within the first electrode to flow therethrough.

10. The plasma processing apparatus according to claim 9, wherein the dielectric has a plurality of through holes including a dummy through hole that does not allow the coolant supplied to the space provided within the first electrode to flow therethrough.

11. A plasma processing apparatus comprising:
a chamber;
a first electrode facing inside of the chamber;
a second electrode provided to face the first electrode within the chamber;
a radio-frequency power supply configured to supply a radio-frequency power to the second electrode;
a feeding rod configured to apply a DC voltage to a center of a surface of the first electrode opposite to a surface facing the inside of the chamber;
a conductive plate provided in parallel to the surface of the first electrode opposite to the surface facing the inside of the chamber, the conductive plate being grounded; and
a dielectric connecting the first electrode and the conductive plate, and having a shape that is rotationally symmetric with respect to the center of the first electrode,
wherein the dielectric has a through hole that connects a space provided within the first electrode, and a pipe connected to outside of the conductive plate.

12. The plasma processing apparatus according to claim 11, wherein the first electrode is grounded at a frequency of the radio-frequency power supplied to the second electrode.

13. The plasma processing apparatus according to claim 11, further comprising a DC power supply configured to apply the DC voltage to the first electrode via the feeding rod.

14. The plasma processing apparatus according to claim 11, wherein the dielectric has a plurality of portions each having the through hole, and the plurality of portions have the same shape and materials and are arranged rotationally symmetrically with respect to the center of the first electrode.

15. The plasma processing apparatus according to claim 11, wherein the dielectric is a ring-shaped member, and is arranged such that a center of the ring-shaped member coincides with the center of the first electrode.

16. The plasma processing apparatus according to claim 15, wherein the ring-shaped member has a plurality of through holes, and the plurality of through holes are provided rotationally symmetrically with respect to the center of the first electrode.

17. The plasma processing apparatus according to claim 11, wherein the through hole allows a processing gas supplied into the chamber to flow therethrough.

18. The plasma processing apparatus according to claim 17, wherein the dielectric has a plurality of through holes, and a through hole different from the through hole that allows the processing gas to flow therethrough allows a coolant supplied to the space provided within the first electrode to flow therethrough.

19. The plasma processing apparatus according to claim 11, wherein the through hole allows a coolant supplied to the space provided within the first electrode to flow therethrough.

* * * * *